United States Patent
Sun et al.

(10) Patent No.: US 11,528,797 B2
(45) Date of Patent: Dec. 13, 2022

(54) METHOD AND SYSTEM FOR GENERATING DROPLETS FOR EUV PHOTOLITHOGRAPHY PROCESSES

(71) Applicant: Taiwan Semiconductor Manufacturing Co., Ltd., Hsinchu (TW)

(72) Inventors: Yu-Kuang Sun, Hsinchu (TW);
Cheng-Hao Lai, Hsinchu (TW);
Yu-Huan Chen, Hsinchu (TW);
Wei-Shin Cheng, Hsinchu (TW);
Ming-Hsun Tsai, Hsinchu (TW);
Hsin-Feng Chen, Hsinchu (TW);
Chiao-Hua Cheng, Hsinchu (TW);
Cheng-Hsuan Wu, Hsinchu (TW);
Yu-Fa Lo, Hsinchu (TW);
Shang-Chieh Chien, Hsinchu (TW);
Li-Jui Chen, Hsinchu (TW);
Heng-Hsin Liu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 42 days.

(21) Appl. No.: 17/233,220

(22) Filed: Apr. 16, 2021

(65) Prior Publication Data

US 2022/0338334 A1    Oct. 20, 2022

(51) Int. Cl.
*H05G 2/00* (2006.01)
*G03F 7/20* (2006.01)

(52) U.S. Cl.
CPC ......... *H05G 2/006* (2013.01); *G03F 7/70033* (2013.01); *H05G 2/005* (2013.01); *H05G 2/008* (2013.01)

(58) Field of Classification Search
CPC ........ H05G 2/006; H05G 2/005; H05G 2/008; G03F 7/70033
See application file for complete search history.

(56) References Cited

U.S. PATENT DOCUMENTS

2007/0087564 A1* 4/2007 Speakman ............ H01L 27/301
                                                                438/674

* cited by examiner

*Primary Examiner* — Nicole M Ippolito
*Assistant Examiner* — Hanway Chang
(74) *Attorney, Agent, or Firm* — Seed IP Law Group LLP

(57) ABSTRACT

An extreme ultraviolet (EUV) photolithography system generates EUV light by irradiating droplets with a laser. The system includes a droplet generator with a nozzle and a piezoelectric structure coupled to the nozzle. The generator outputs groups of droplets. A control system applies a voltage waveform to the piezoelectric structure while the nozzle outputs the group of droplets. The waveform causes the droplets of the group to have a spread of velocities that results in the droplets coalescing into a single droplet prior to being irradiated by the laser.

20 Claims, 10 Drawing Sheets

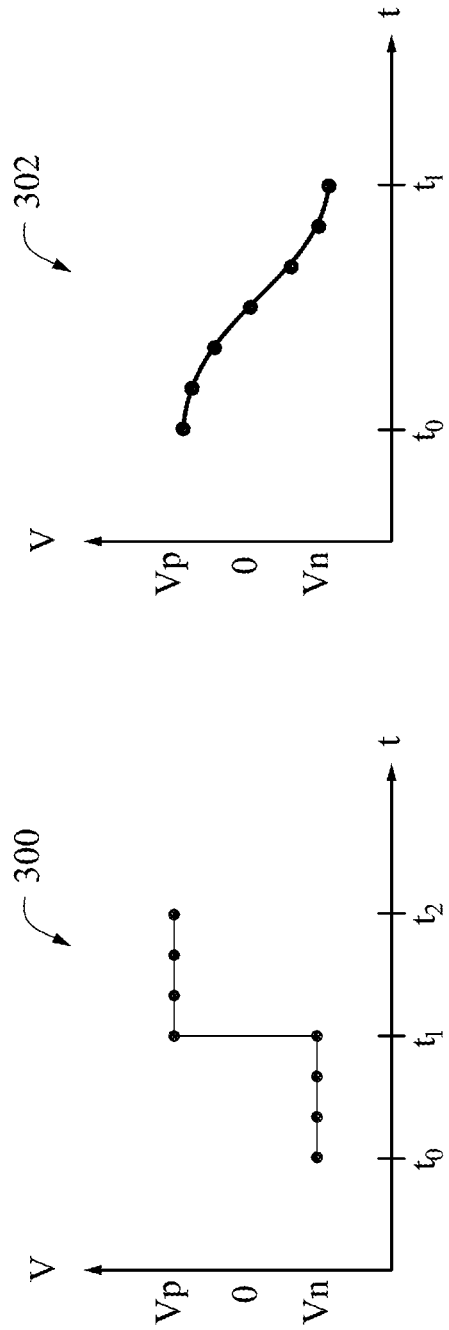
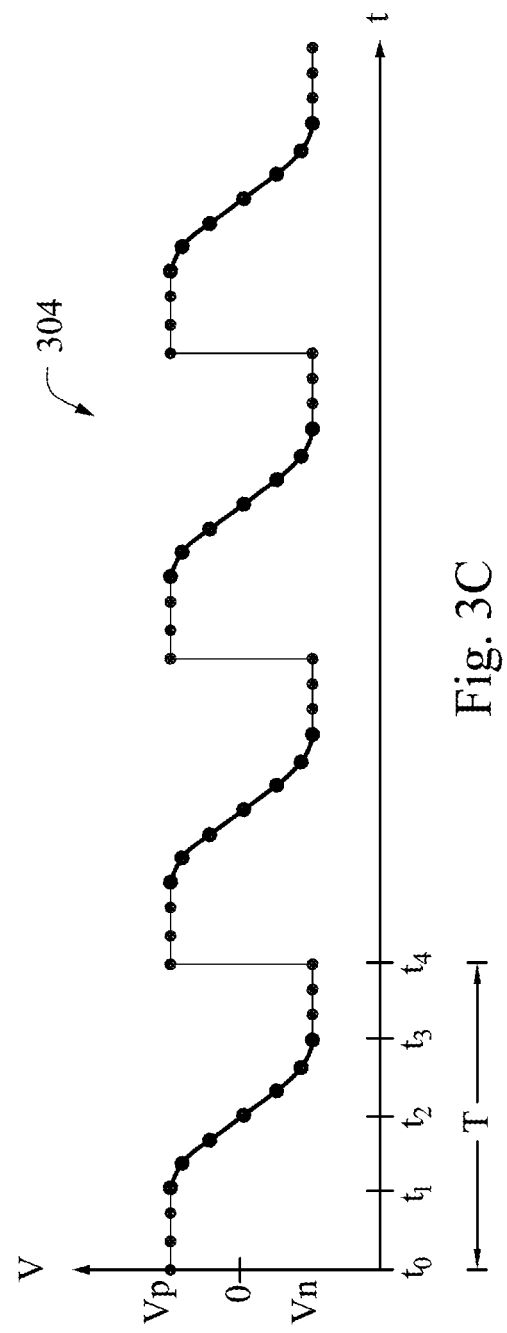
Fig. 3A
Fig. 3B
Fig. 3C

METHOD AND SYSTEM FOR GENERATING DROPLETS FOR EUV PHOTOLITHOGRAPHY PROCESSES

BACKGROUND

There has been a continuous demand for increased computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate.

The features in an integrated circuit are produced, in part, with the aid of photolithography. Traditional photolithography techniques include generating a mask outlining the pattern of features to be formed on an integrated circuit die. The photolithography light source irradiates the integrated circuit die through the mask. The size of the features that can be produced via photolithography of the integrated circuit die is limited, in part, on the lower end, by the wavelength of light produced by the photolithography light source. Smaller wavelengths of light can produce smaller feature sizes.

Extreme ultraviolet (EUV) light is used to produce particularly small features due to the relatively short wavelength of EUV light. For example, EUV light is typically produced by irradiating droplets of selected materials with a laser beam. The energy from the laser beam causes the droplets to enter a plasma state. In the plasma state, the droplets emit EUV light. The EUV light travels toward a collector with an elliptical or parabolic surface. The collector reflects the EUV light to a scanner. The scanner illuminates the target with the EUV light via a reticle. However, if the droplets are not properly formed and irradiated, then there may be insufficient EUV light to perform an EUV process. Accordingly, the photolithography processes may fail and the resulting integrated circuits will not be functional.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3C are graphs of voltage waveforms, in accordance with some embodiments.

DETAILED DESCRIPTION

Figure 1:
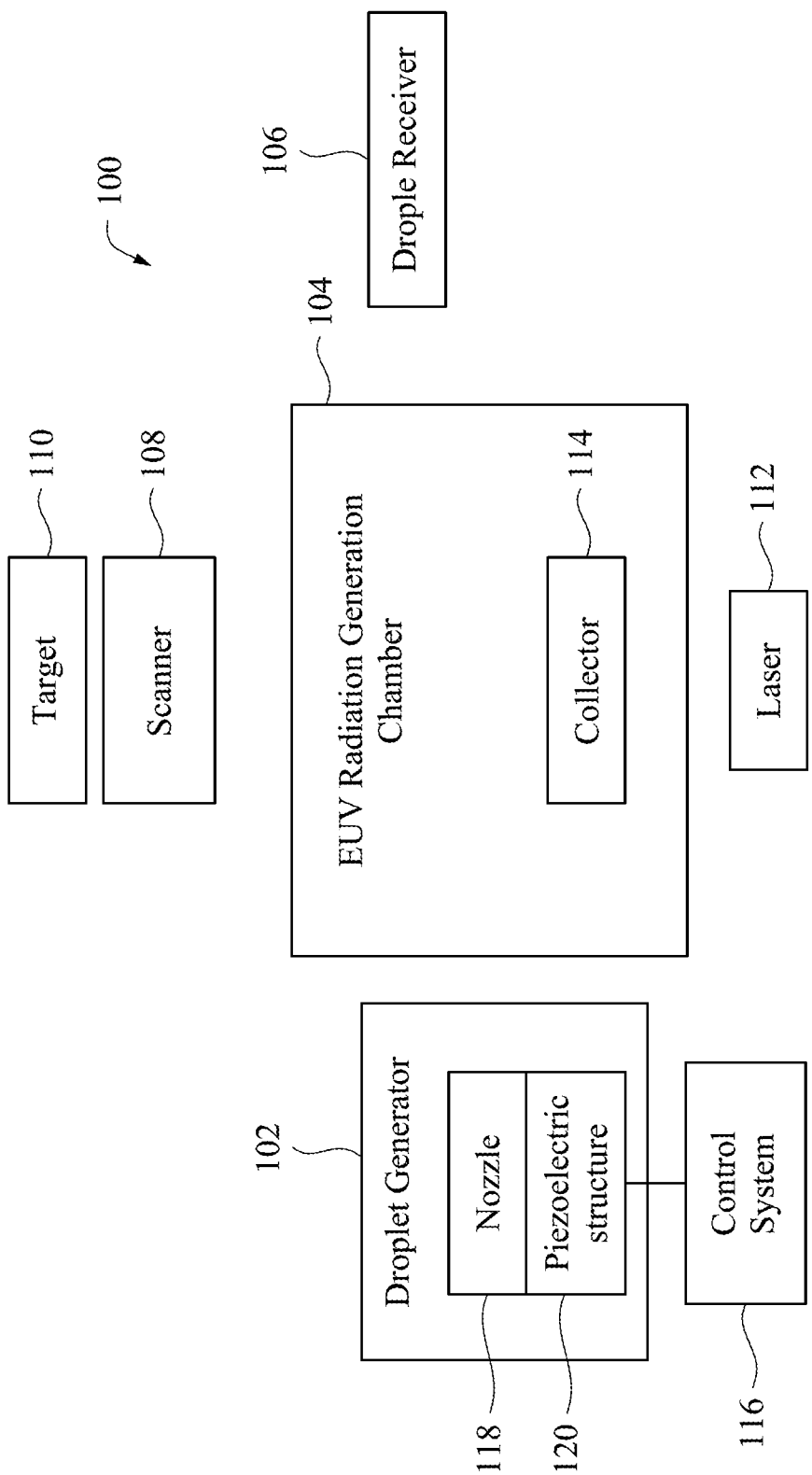
FIG. 1 is a block diagram of an EUV system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "some embodiments" or "an embodiment" means that a particular feature, structure or characteristic described in connection with the embodiment is included in at least some embodiments. Thus, the appearances of the phrases "in some embodiments" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide many benefits to EUV photolithography systems. Embodiments of the present disclosure generate droplets in a manner that ensures that the droplets are in a desirable state before being irradiated with a laser. A droplet generator outputs groups of droplets. A spread of velocities is imparted to the droplets of each group so that the droplets coalesce into a single large droplet prior to irradiation by the laser. The droplet generator includes a nozzle surrounded by a piezoelectric structure. A voltage waveform is applied to the piezoelectric structure to cause the piezoelectric structure to expand or contract around the nozzle. The expansion and contraction of the piezoelectric structure imparts different velocities to the droplets of each group in accordance with the voltage waveform. The voltage waveform includes a combination of a sine wave and a step function. This combination ensures that the droplets of a group have a spread of velocities that will cause coalescence of the droplets into a single large droplet prior to irradiation by the laser. Because the droplets coalesce into a single large droplet prior to irradiation, the irradiated large droplet emits a large amount of EUV light. The result is that photolithography processes are properly performed, leading to increases in wafer yields and better performance of integrated circuits.

FIG. 1 is a block diagram of an EUV photolithography system 100, according to some embodiments. As will be set forth in more detail below, the components of the EUV photolithography system 100 cooperate to generate properly formed droplets and EUV light. As used herein, the terms "EUV light" and "EUV radiation" can be used interchangeably.

The EUV photolithography system 100 includes a droplet generator 102, an EUV generation chamber 104, a droplet receiver 106, a scanner 108, a laser 112, and a collector. The droplet generator 102 outputs droplets into the EUV generation chamber 104. The laser 112 irradiates the droplets with pulses of laser light within the EUV generation chamber 104. The irradiated droplets emit EUV light. The EUV light is collected by a collector 114 and reflected toward the scanner 108. The scanner 108 conditions the EUV light and focuses the EUV light onto the target 110. The target 110 may include a semiconductor wafer. After irradiation by the laser 112, the droplets exit the EUV generation chamber 104 and are received by the droplet receiver 106. Further details regarding each of these components and processes are provided below.

The droplet generator 102 generates and outputs a stream of droplets. The droplets can include tin, though droplets of other material can be utilized without departing from the scope of the present disclosure. The droplets move at a high rate of speed toward the droplet receiver 106. The droplets have an average velocity between 60 m/s to 200 m/s. The droplets have an initial diameter between 10 μm and 200 μm. The droplet generator can generate different numbers of droplets per second than described above without departing from the scope of the present disclosure. The droplet generator 102 can also generate droplets having different initial velocities and diameters than those described above without departing from the scope of the present disclosure.

More particularly, the droplet generator 102 generates groups of droplets. The droplets of each group are initially separate from each other when leaving the droplet generator 102. As the droplets of a group travel through the EUV generation chamber 104, the droplets join together into a single large droplet. As will be set forth in more detail below, the droplet generator 102 imparts different initial velocities to the droplets of a group. The droplets of a group are output one at a time in a sequence. The initial velocity of the droplets of a group increases with successive droplets. The spread of velocities ensures that the droplets will join together. In particular, the spread of velocities is selected to ensure that the droplets of a group join into a single droplet prior to arriving at a location within the EUV generation chamber 104 at which irradiation by the laser 112 occurs. Further details regarding the spread of velocities and how the spread of velocities is imparted are set forth below.

In some embodiments, the EUV generator 102 is a laser produced plasma (LPP) EUV generation system. As the droplets travel through the EUV generation chamber 104 between the droplet generator 102 and the droplet receiver 106, the droplets are irradiated by the laser 112. When a droplet is irradiated by the laser 112, the energy from the laser causes the droplet to form a plasma. The plasmatized droplets generate EUV light. This EUV light is collected by the collector 114 and passed to the scanner 108 and then on to the target 110.

In some embodiments, the laser 112 is positioned external to the EUV generation chamber 104. During operation, the laser 112 outputs pulses of laser light into the EUV generation chamber 104. The pulses of laser light are focused on a point through which the droplets pass on their way from the droplet generator 102 to the droplet receiver 106. Each pulse of laser light is received by a droplet. When the droplet receives the pulse of laser light, the energy from the laser pulse generates a high-energy plasma from the droplet. The high-energy plasma outputs EUV light.

In some embodiments, the laser 112 irradiates the droplet with two pulses. A first pulse causes the droplet to flatten into a disk like shape. The second pulse causes the droplet to form a high temperature plasma. The second pulse is significantly more powerful than the first pulse. The laser 112 and the droplet generator 102 are calibrated so that the laser emits pairs of pulses such that the droplet is irradiated with a pair of pulses. The laser can irradiate droplets in a manner other than described above without departing from the scope of the present disclosure. For example, the laser 112 may irradiate each droplet with a single pulse or with more pulses than two. In some embodiments, there are two separate lasers 112. A first laser 112 delivers the flattening pulse. A second laser 112 delivers the plasmatized pulse.

In some embodiments, the light output by the droplets scatters randomly in many directions. The photolithography system 100 utilizes the collector 114 to collect the scattered EUV light from the plasma and output the EUV light toward the scanner 108.

The scanner 108 includes scanner optics. The scanner optics include a series of optical conditioning devices to direct the EUV light to the reticle. The scanner optics may include refractive optics such as a lens or a lens system having multiple lenses (zone plates). The scanner optics may include reflective optics, such as a single mirror or a mirror system having multiple mirrors. The scanner optics direct the ultraviolet light from the EUV generator 102 to a reticle.

The ultraviolet light reflects off of the reticle back toward further optical features of the scanner optics. In some embodiments, the scanner optics include a projection optics box. The projection optics box may have refractive optics, reflective optics, or combination of refractive and reflective optics. The projection optics box may include a magnification less than 1, thereby reducing the patterned image included in the EUV light reflected from the reticle. The projection optics box directs the EUV light onto the target 110, for example, a semiconductor wafer.

The EUV light includes a pattern from the reticle. In particular, the reticle includes the pattern to be defined in the target 110. After the EUV light reflects off of the reticle, the EUV light contains the pattern of the reticle. A layer of photoresist typically covers the target during extreme ultraviolet photolithography irradiation. The photoresist assists in patterning a surface of the semiconductor wafer in accordance with the pattern of the reticle.

The droplet generator 102 includes a nozzle 118. The nozzle 118 outputs the droplets. The droplet generator 102 also includes a piezoelectric structure 120 coupled to the nozzle 118. The piezoelectric structure 120 may surround the nozzle 118 such that the piezoelectric structure 120 is coaxial with the nozzle 118. If the nozzle 118 is cylindrical, the piezoelectric structure 120 may also be cylindrical. The piezoelectric structure 120 is made of a piezoelectric material that expands or contracts based on applied voltages. In some embodiments, the piezo electric structure includes a piezoelectric material such as lead zirconate titanate (PZT) or another suitable piezoelectric material.

The piezoelectric structure 120 contracts and expands based on a voltage that is applied to the piezoelectric structure 120. For example, positive voltages may cause expansion of the piezoelectric structure 120. Negative voltages may cause contraction of the piezoelectric structure 120. Depending on the type of the piezoelectric structure, negative voltages may cause expansion of the piezoelectric structure 120 and positive voltages may cause contraction of the piezoelectric structure 120. Contraction of the piezoelectric structure may result in increased pressure exerted on the nozzle 118. Expansion of the piezoelectric structure 120 may result in decreased pressure exerted on the nozzle 118. Accordingly, the application of voltages to the piezoelectric structure 120 can influence the nozzle 118.

The piezoelectric structure 120 is coupled to a control system 116. The control system 116 controls the application of voltages to the piezoelectric structure 120. In particular, the control system 116 can control a voltage waveform applied to the piezoelectric structure 120. In some embodiments, the power source is coupled to the piezoelectric structure 120 and to the control system 116. The control system 116 controls the power source to apply the voltage waveform to the piezoelectric structure 120.

The control system 116 can include one or more processors, one or more memories, and communication resources. The control system 116 can control the various components of the EUV photolithography system 100. The control system 116 can control the components in an automated manner or by executing commands input by an operator. The control system can includes components and resources in disparate locations or in a single location.

When the piezoelectric structure 120 expands, droplet speed decreases. When the piezoelectric structure contracts droplet speed increases. The changes in droplet speed may be likened to the velocity of a fluid flowing through a tube. The flow rate of the fluid is constant throughout the tube, but the velocity of the fluid changes with changes in diameter of the tube. When the diameter of the tube increases, the velocity of the fluid decreases. When the diameter of the tube decreases, the velocity of the fluid increases. In a similar manner, the increases and decreases in pressure exerted by the piezoelectric structure 120 on the nozzle 118 cause decreases and increases in velocity of the droplets through the nozzle 118. This is the result of sonic pressure pulses within the nozzle 118 caused by expansion and contraction of the piezoelectric structure 120.

The control system 116 applies a voltage waveform to the piezoelectric structure 120 selected to induce a spread of velocities in the droplets of a group. The waveform makes one cycle for each group of droplets. At the beginning of the waveform, the voltage is high. The initial high-voltage causes expansion of the piezoelectric structure 120, resulting in the initial droplets having a relatively slow velocity. The voltage waveform gradually decreases from a high voltage to a low-voltage. As the waveform decreases from the high-voltage to the low-voltage, each successive droplet receives a higher velocity until a final droplet receives the highest velocity. A droplet that passes through the nozzle when the waveform is at 0 V receives an average velocity $v_a$. The velocity of the first droplet of the group is $v_a+\Delta v$. The velocity of the final droplet of the group is V minus $\Delta v$. All droplets between the first droplet and the final droplet have a voltage somewhere between $v_a+\Delta v$ and $v_a-\Delta v$. The average velocity $v_a$ may also be considered as the velocity of the center of mass of the group of droplets.

The spread of velocities is imparted to the droplets of the group by the waveform applied to the piezoelectric structure 120 that causes all of the droplets to combine into a single droplet as the droplets pass through the EUV generation chamber 104. Because later droplets are faster than earlier droplets in a group, the later droplets catch up with and coalesce with the earlier droplets until all droplets have joined together into a single droplet and traveling with the average velocity $v_a$. $\Delta v$ and $v_a$ are selected to ensure that the droplets of a group combine into a single droplet prior to crossing the point in the EUV generation chamber 104 at which the laser pulses are received from the laser 112.

Figure 2A:
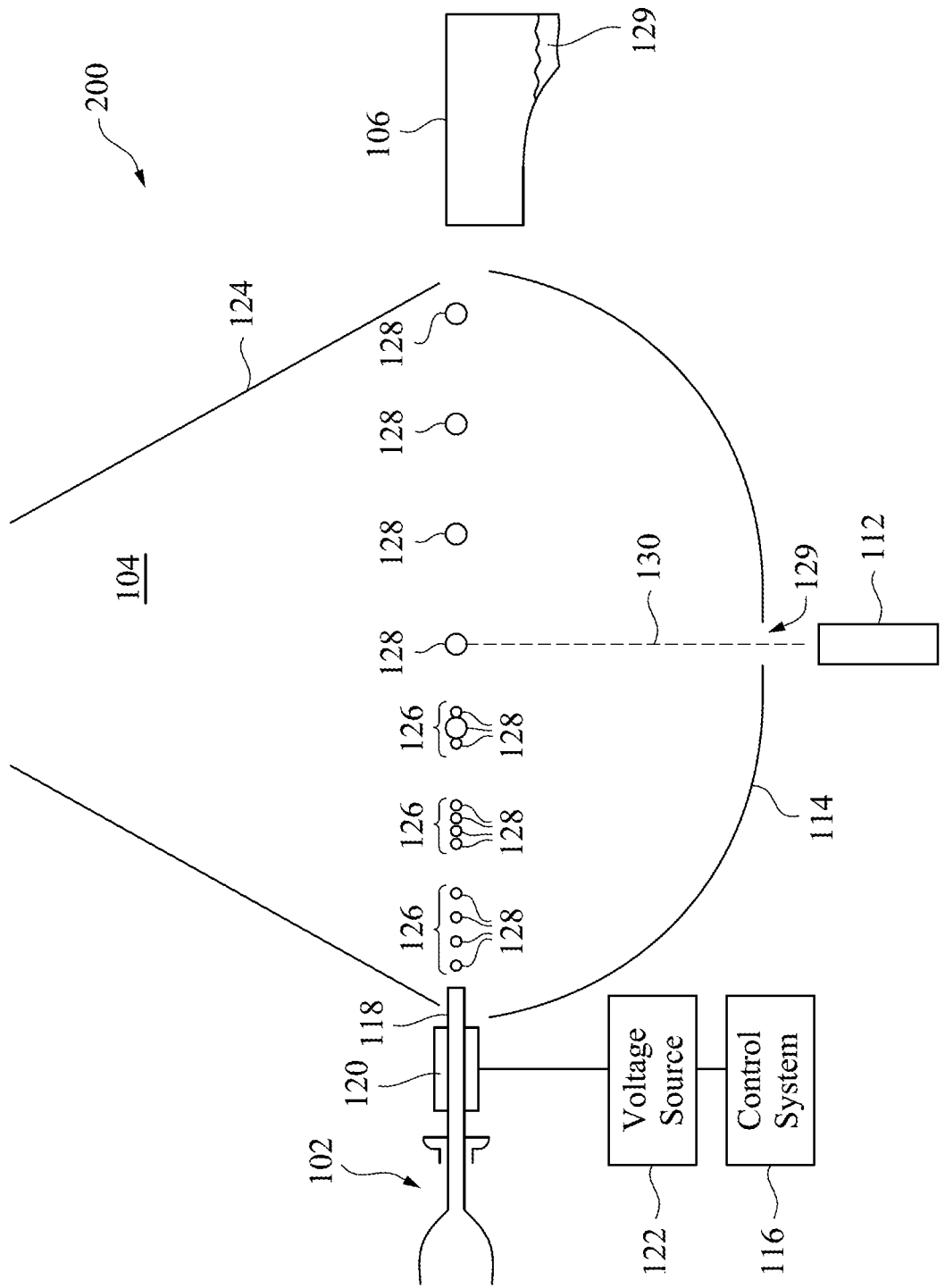
FIGS. 2A and 2B are illustrations of an EUV system, in accordance with some embodiments.
Figure 2B:
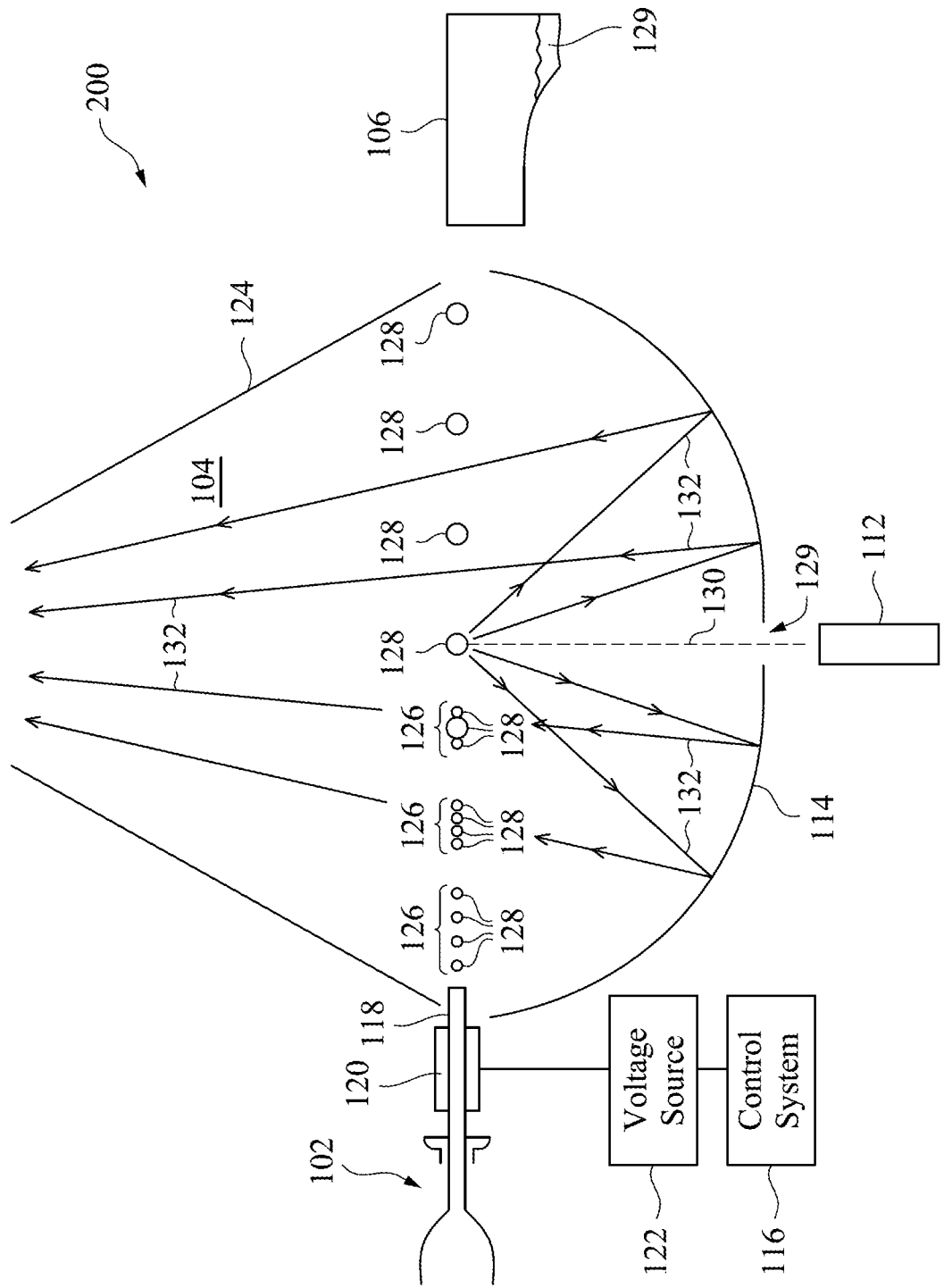

In some embodiments, the voltage waveform applied to the piezoelectric structure is a combination of a first voltage waveform and a second voltage waveform. The first voltage waveform is a step function. The second voltage waveform is half of a sine wave. The waveform begins at a positive voltage amplitude and remains at the positive voltage amplitude for a brief period of time and then begins to decline in accordance with a sine wave declining from the positive voltage amplitude to a negative voltage amplitude FIGS. 2A-2B are illustrations of a photolithography system 200, according to an embodiment. The photolithography system 200 is an extreme ultraviolet photolithography system that generates extreme ultraviolet radiation by laser plasma interaction. The plasma can be generated in a substantially similar manner as described in relation to FIG. 1. FIG. 2A illustrates the photolithography system 200 without the extreme ultraviolet radiation. FIG. 2B illustrates the photolithography system 200 with the extreme ultraviolet radiation.

With reference to FIG. 2A, the photolithography system 200 includes a plasma generation chamber 104, a laser 112, a scanner 103, a collector 114, a droplet generator 102, and a droplet receiver 106. The EUV generation chamber 104 is defined by the collector 114 and an enclosure 124 coupled to the collector 114. The EUV photolithography system 200 includes a droplet generator 102 and a droplet receiver 106. The components of the photolithography system 200 cooperate together to generate extreme ultraviolet radiation and to perform photolithography processes with the extreme ultraviolet radiation.

The droplet generator 102 generates and outputs groups 126 of droplets 128. The droplets can include, tin, though droplets of other material can be utilized without departing from the scope of the present disclosure. The droplets 128 move at a high rate of speed toward the droplet receiver 106.

The droplet generator 102 periodically emits a group 126 of droplets 128. The view of FIG. 2A illustrates three groups 126 of droplets 128 that have not yet coalesced into a single droplet 126. The view of FIG. 2A illustrates, at a laser irradiation point location within the EUV generation chamber 104, a large droplet 128 that has coalesced from a group 126 of droplets 128. The view of FIG. 2A illustrates three large droplets 128 that have coalesced and have passed beyond the laser irradiation location. In the view of FIG. 2A, each group 126 initially includes four droplets 128. However, in practice, each group 126 may include many more droplets than four. In some embodiments, each group 126 includes 50 or more droplets 128.

The piezoelectric structure 120 is coupled to the nozzle 118. The piezoelectric structure 120 surrounds a portion of the nozzle 118. The piezoelectric structure 120 is coaxial with the nozzle 118. As described previously, the piezoelectric structure 120 expands when a positive voltage is applied to the piezoelectric structure. The piezoelectric structure 120 contracts when a negative voltage is applied to the piezoelectric structure 120. The expansion and contraction of the piezoelectric structure 120 helps to impart a spread of velocities to the droplets 128 in each group 126.

A voltage source 122 is coupled to the piezoelectric structure 120. The voltage source 122 applies a voltage to the piezoelectric structure 120. In particular, the voltage source 122 applies a repeating voltage waveform to the piezoelectric structure 120. The nozzle 118 outputs a group 126 of droplets 128 during each cycle of the voltage waveform. The voltage waveform is selected to ensure that droplets at the rear of the group 126 have higher velocities than droplets at the front of the group 126.

In some embodiments, the voltage waveform is a combination of a step function and half of a sine wave. The voltage is initially at a high voltage and remains at the high voltage for a brief period at the beginning of the waveform. The voltage then begins to decline from the high voltage to a low voltage in the form of a sine wave. Once the voltage waveform arrives at the low-voltage, the voltage waveform remains at the low-voltage for a brief period of time until the end of the voltage waveform. At the end of the voltage waveform, the voltage changes from the low-voltage to the high voltage after the manner of a step function. Further details regarding the voltage waveform are given in relation to FIG. 3. Other waveforms can be utilized without departing from the scope of the present disclosure.

As can be seen in FIG. 2A, the droplets 128 of the group 126 closest to the nozzle 118 are spaced farther apart than are the droplets 128 of the next closest group 126. This is because the selected spread of velocities ensures that droplets 128 at the back of a group catch up with and join together with droplets at the front of a group 126 as the droplets travel toward the laser irradiation point. The group 126 third closest to the nozzle 118 has begun coalescing into a larger droplet 128. The large droplet 128 at the laser irradiation point corresponds to a group 126 of droplets 128 that have entirely coalesced into a single droplet 128.

After passing through the laser irradiation point, the coalesced droplets 128 are received by the droplet receiver 106. The droplet receiver 106 may include a droplet reservoir 127. The droplets 128 travel into the droplet receiver 106, impact a back wall of the droplet receiver 106, and drop into the droplet reservoir 127. Other configurations for a droplet receiver 106 can be utilized without departing from the scope of the present disclosure The laser 112 is positioned behind the collector 114. During operation, the laser 112 outputs pulses of laser light 130. The pulses of laser light 130 are focused on a point through which the droplets pass on their way from the droplet generator 102 to the droplet receiver 106. Each pulse of laser light 130 is received by a fully coalesced droplet 128 at the laser irradiation point. When a droplet 128 receives the pulse of laser light 130, the energy from the laser pulse generates a high-energy plasma from the droplet 128. The high-energy plasma outputs extreme ultraviolet radiation.

In some embodiments, the laser 112 is a carbon dioxide ($CO_2$) laser. The $CO_2$ laser emits radiation or laser light 130 with a wavelength centered around 9.4 μm or 10.6 μm. The laser 112 can include lasers other than carbon dioxide lasers and can output radiation with other wavelengths than those described above without departing from the scope of the present disclosure.

In some embodiments, the laser 112 irradiates each droplet 128 with two pulses. A first pulse causes the droplet 128 to flatten into a disk like shape. The second pulse causes the droplet 128 to form a high temperature plasma. The second pulse is significantly more powerful than the first pulse. The laser 112 and the droplet generator 102 are calibrated so that the laser 112 emits pairs of pulses such that each droplet 128 is irradiated with a pair of pulses. The laser 112 can irradiate droplets 128 in a manner other than described above without departing from the scope of the present disclosure. For example, the laser 112 may irradiate each droplet 128 with a single pulse or with more pulses than two. Moreover, the primary laser here can not only cause droplet into disk-like shape but also can be mist or vapor state.

FIG. 2B illustrates EUV light 132 being emitted from the droplet 128 receiving the laser light pulse 130. When the droplets 128 are converted to a plasma, the droplets 128 output EUV light 132. In an example in which the droplets 128 are tin, the droplets 128 output EUV light 132 with a wavelength centered between 10 nm and 15 nm. More particularly, in some embodiments, the tin plasma emits EUV light with a central wavelength of 13.5 nm. Materials other than tin can be used for the droplets 128 without departing from the scope of the present disclosure. Such other materials may generate extreme ultraviolet radiation with wavelengths other than those described above without departing from the scope of the present disclosure.

In some embodiments, the EUV light 132 output by the droplets 128 scatters in many directions. The photolithography system 100 utilizes the collector 114 to collect the scattered EUV light 132 from the plasma and output the EUV light 132 toward a photolithography target.

In some embodiments, the collector 114 is a parabolic or elliptical mirror. The scattered EUV light 132 is collected and reflected by the parabolic or elliptical mirror with a trajectory toward a scanner (not shown in FIGS. 2A and 2B). The scanner utilizes a series of optical conditioning devices such as mirrors and lenses to direct the extreme ultraviolet radiation to the photolithography mask. The EUV light 132 reflects off of the mask onto a photolithography target. The EUV light 132 reflected from the mask patterns a photoresist or other material on a semiconductor wafer. For purposes of the present disclosure, particularities of the mask and the various configurations of optical equipment in the scanner are not shown.

In some embodiments, the collector 114 includes a central aperture 129. The pulses of laser light 130 pass from the laser 112 through the central aperture 129 toward the stream of droplets 128. This enables the collector 114 to be positioned between the laser 112 and the scanner.

FIG. 3A illustrates a graph of a step function voltage waveform 300, according to one embodiment. The x-axis corresponds to time. The y-axis corresponds to voltage. At time to, the step function voltage waveform 300 is initially at a negative voltage amplitude $V_n$. At time $t_1$, the step function voltage waveform 300 changes, in a discontinuous manner, from the negative voltage amplitude $V_n$ to a positive voltage amplitude $V_p$. In some embodiments, the negative voltage amplitude $V_n$ is equal to the positive voltage amplitude $V_p$ multiplied by −1. The step function voltage waveform 300 continues at the positive voltage amplitude $V_p$ until time $t_2$. The relevance of the step function voltage waveform 300 to the EUV photolithography system will be made clearer with reference to FIG. 3C.

FIG. 3B illustrates a graph of a half sine wave voltage waveform 302, according to one embodiment. At time to, the half sine wave voltage waveform 302 is at a positive voltage amplitude $V_p$. Between times $t_0$ and time $t_1$, the half sine wave voltage waveform 302 decreases from the positive voltage amplitude $V_p$ to a negative voltage amplitude $V_n$. The relevance of the half sine wave voltage waveform 302 to the EUV photolithography system will be made clearer with reference to FIG. 3C.

FIG. 3C is a graph of a voltage waveform 304 applied to the piezoelectric structure 120 of FIG. 1 or of FIG. 2A or 2B, according to one embodiment. The x-axis corresponds to time. The y-axis corresponds to voltage. The voltage waveform 304 is a combination of the square function voltage waveform 300 of FIG. 3A and the half sine wave voltage waveform 302 of FIG. 3B. The voltage waveform 304 is a repeating voltage waveform with a period T.

Times $t_0$ to $t_4$ illustrate a single period T of the voltage waveform 304. At time to, the voltage waveform 304 is initially at a positive voltage amplitude $V_p$. The voltage waveform 304 remains at the positive voltage amplitude $V_p$ until time $t_1$. The portion of the voltage waveform 304 between times $t_0$ and $t_1$ corresponds to the portion of the square wave voltage waveform 300 of FIG. 3A between times $t_1$ and $t_2$. At time $t_1$, the voltage waveform 304 begins to decrease from the positive voltage amplitude $V_p$ toward a negative voltage amplitude $V_n$. At time $t_2$, the voltage waveform 304 is a 0 V. At time $t_3$, the voltage waveform 304 reaches the negative voltage amplitude $V_n$. The portion of the voltage waveform 304 between times $t_1$ and $t_3$ corresponds to the half sine wave voltage waveform 302 of FIG. 3B. Between times $t_3$ and $t_4$, the voltage waveform 304 remains constant at the negative voltage amplitude $V_n$. The portion of the waveform 304 between times $t_3$ and $t_4$ corresponds to the portion of the square wave voltage waveform 300 of FIG. 3A between times $t_0$ and $t_1$. At time $t_4$, the voltage waveform 304 jumps to the positive voltage amplitude $V_p$ in the manner of a step function. Accordingly, the voltage waveform 304 corresponds to a combination of the square wave voltage waveform 300 of FIG. 3A and the half sine wave voltage waveform 302 of FIG. 3B.

Each cycle of the voltage waveform 304 has a period T. In one example, the period T is between 10 μs and 30 μs. Each cycle of the voltage waveform 304 is applied to the piezoelectric structure 120 while outputting a group 126 of droplets 128 from the nozzle 118. The droplets 128 that are output during times $t_0$ and $t_1$ will have a velocity equal to an average velocity $v_a$−Δv. The droplets 128 output between times $t_1$ and $t_3$ will have increasing velocities. In other words, between times $t_1$ and $t_3$ each droplet 128 will have a higher velocity than the droplet 128 immediately preceding. A droplet 128 output at time $t_2$ will have the average velocity $v_a$. A droplet 128 output at time $t_3$ will have a velocity equal to the average velocity $v_a$+Δv. Droplets output between times $t_3$ and $t_4$ will all have the velocity $v_a$ plus Δv.

The positive voltage amplitude $V_p$ and the negative voltage amplitude $V_n$ are selected to provide a value of Δv that causes all of the droplets 128 to coalesce into a single droplet before arriving at the laser irradiation point. In some embodiments, the positive voltage amplitude $V_p$ is between 3 V and 12 V. The negative voltage amplitude $V_n$ is between −3 V and −12 V. A voltage between these amplitudes may be sufficient to ensure coalescence of the droplets 128 of the group 126 prior to arriving at the laser irradiation point in an example in which the laser irradiation point is about 0.5 m from the nozzle 118 and the average velocity $v_a$ is 80 m/s. Other values of $V_p$ and $V_n$ can be utilized without departing from the scope of the present disclosure. Other values of the average velocity $v_a$ and the distance between the nozzle 118 and the laser irradiation point can be utilized without departing from the scope of the present disclosure. In particular, the values of $V_p$ and $V_n$ can be selected based on the particular configuration of the nozzle 118, the average velocity $v_a$, the initial distance between the first and last droplets 128 of a group 126, and the distance between the nozzle 118 and the laser irradiation point. In some embodiments, the first droplet 128 and the last droplet 128 of a group 126 are initially separated by a distance between 0.5 mm and 3 mm, though other initial separation distances can be utilized without departing from the scope of the present disclosure.

Figure 4:
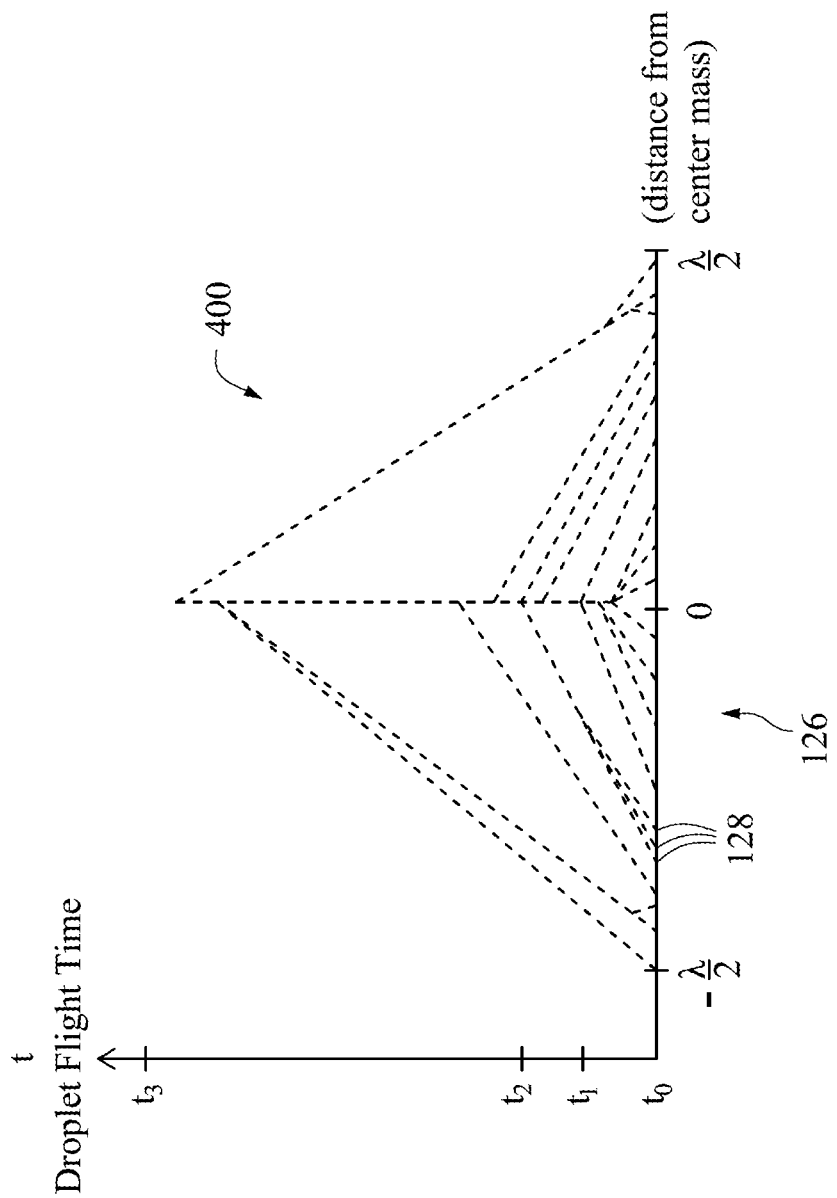
FIG. 4 is a graph illustrating droplet coalescence, in accordance with some embodiments.
Figure 4:
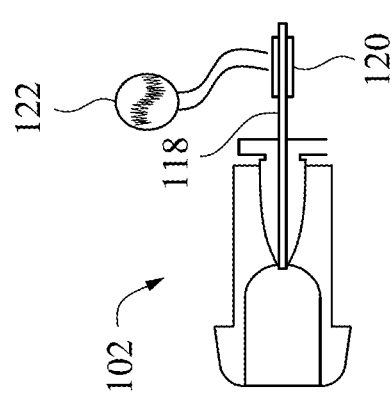

FIG. 4 is a graph 400 illustrating the coalescence of a group 126 of droplets 128 of an EUV photolithography system, according to some embodiments. The x-axis corresponds to the distance between a droplet 128 and the center of mass of the group 126 of droplets 128. The y-axis corresponds to the time of flight of the droplets. FIG. 4 also illustrates the droplet generator 102 including the nozzle 118 that outputs the droplets 128, and the piezoelectric structure 120 that receives the voltage waveform.

At time to, all the droplets 128 of the group 126 have been output from the nozzle 118. The value λ corresponds to the total distance between the first droplet 128 and the last droplet 128. Accordingly, the last droplet 128 is at a value of negative λ/2 from the center of mass of the group 126. The first droplet 128 is at a value of λ/2 from the center of mass of the group 126. As described previously, the droplets 128 will have different velocities. In general, later droplets 128 will have higher velocities than earlier droplets 128 of the group 126. The droplet 128 furthest to the right at time to corresponds to the first or earliest droplet 128. The droplet 128 furthest to the left at time to corresponds to the last or latest droplets 128 of the group 126.

At time $t_1$ some of the droplets 128 have coalesced at the center of mass. This corresponds to the center of mass catching up to some of the earlier droplets 128 and some of the later droplets 128 catching up to the center of mass. At time $t_2$, the center of mass has caught up to more of the earlier droplets 128 and more of the later droplets 128 have caught up to the center mass. However, at time $t_2$, the center mass is not caught up to the earliest droplets 128 and the latest droplets 128 have not caught up to the center mass. At time $t_3$ the center mass has finally caught up to the earliest fire droplets 128 and the latest fire droplets 128 have finally caught up to the center mass of the group 126. Accordingly time $t_3$ corresponds to the total coalescence time $t_c$ of the group 126 of droplets 128 the total coalescence time is the time at which all of the droplets 128 of a group 126 have coalesced into a single droplet 128 having the mass of the whole group 126.

As set forth previously, it is desirable for total coalescence to occur before the center of mass reaches the laser irradiation point. This will depend on the average velocity of the droplets 128 (or the velocity of the center mass), the value of $\Delta v$, the initial distance $\lambda$ between the first and last droplets 128, and the distance between the nozzle 118 and the laser irradiation point. The coalescence length $l_c$ is given by the following formulas:

$$l_c = t_t{}^* v_a = (\lambda/2{}^* v_a)/\Delta v.$$

$\Delta v$ is given by the following relationship:

$$\Delta v = V_p{}^* TF,$$

where TF is the transfer function associated with the voltage applied to the piezoelectric structure 120 and the change in velocity imparted to the droplets within the nozzle 118 based on the piezoelectric structure 120.

Figure 5B:
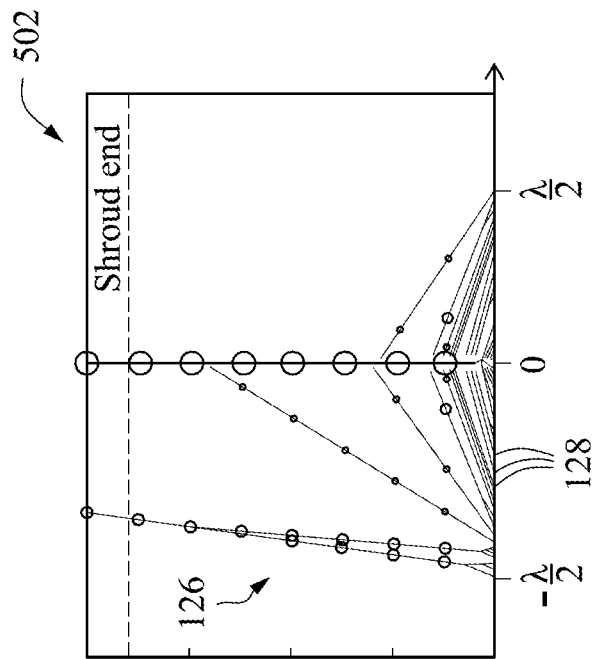
FIG. 5B is a graph illustrating droplet coalescence in connection with the voltage waveform of FIG. 5A, in accordance with some embodiments.
Figure 5A:
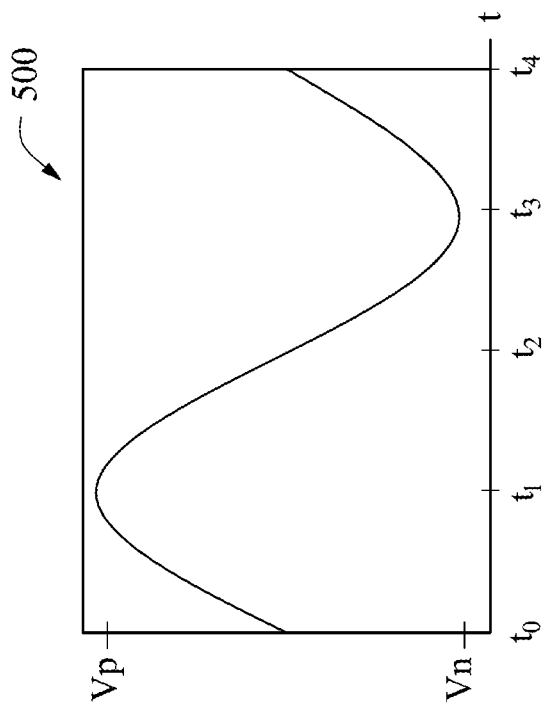
FIG. 5A is a graph of a voltage waveform, in accordance with some embodiments.

FIG. 5A illustrates a sine wave voltage waveform 500. This is one voltage waveform that could be applied to the piezoelectric structure 120. However, as will be set forth with relation to FIG. 5B, the sine wave voltage waveform 500 has some drawbacks compared to the voltage waveform 304 of FIG. 3C. At time $t_0$, the voltage is 0 V. Accordingly, droplets 128 output from the nozzle 118 at or near this time will have a velocity equal to or nearly equal to the average velocity $v_a$ or the velocity of the center mass. At time $t_1$ the voltage is at $V_p$. Accordingly, droplets 128 output near time $t_1$ will have a much lower velocity than $v_a$. At time t3 the waveform reaches the negative voltage amplitude $V_a$. Accordingly, droplets 128 output near time $t_3$ will have a much higher velocity than $v_a$. At time $t_4$, the waveform has returned to 0 V. Accordingly, droplets 128 output near time $t_4$ will have velocities equal to or nearly equal to the average velocity $v_a$.

The droplets output between times $t_1$ and $t_3$ may have no problem coalescing with the center of mass. However, the droplets output near times $t_0$ and $t_4$ may not coalesce with the center of mass at all because they are velocities or near the average velocity $v_a$. This is illustrated with reference to FIG. 5B. In one example, the period between times $t_0$ and $t_4$ is about 20 μs. Accordingly, time $t_1$ is about 5 μs. Time $t_2$ is about 10 μs. Time $t_3$ is about 15 μs. Time $t_4$ is about 20 μs. Other time periods can be utilized without departing from the scope of the present disclosure.

FIG. 5B is a graph 502 illustrating the coalescence of droplets 128 in group 126 output from the nozzle 118 while the waveform 500 is applied to the piezoelectric structure 120. The x-axis corresponds to the distance of droplets from the center of mass in millimeters. The y-axis corresponds to the distance from the nozzle 118. The initial total distance between the first droplet 128 and the last droplet 128 of the group 126 is $\lambda$. In one example, $\lambda$ is about 1.5 mm, though other values can be utilized without departing from the scope of the present disclosure. Droplets 128 that are initially within about $\lambda/3$ from the center of mass are able to coalesce within a relatively short distance from the nozzle, for example by about 150 mm away from the nozzle 118. These droplets correspond to the droplets output between times $t_1$ and $t_3$. However, the droplets 128 that are initially nearly $\lambda/2$ away from the center of mass do not quickly coalesced with the center mass. This is because these droplets 128 were output near $t_0$ or $t_4$ and have velocities nearly equal to the velocity of the center of mass. Accordingly, the earliest and latest droplets 128 will not coalesce before the laser irradiation point.

Figure 6A:
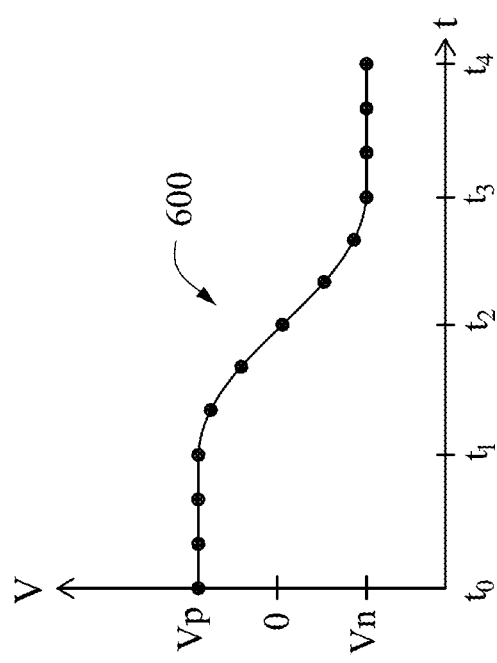
FIG. 6A is a graph of a voltage waveform, in accordance with some embodiments.

FIG. 6A is a graph of a voltage waveform 600, according to one embodiment. The voltage waveform 600 is substantially similar to the voltage waveform 304 of FIG. 3C. In particular, the voltage waveform 600 is a combination of a step function and a half sine wave. Benefits of this waveform are shown in relation to FIG. 6B. In some embodiments, the period T of the waveform 600 is 20 μs. The contrast between the waveform 500 and the waveform 600 can be seen most particularly between times $t_0$ and $t_1$ and between times $t_3$ and $t_4$. In the waveform 500, the voltage at times $t_0$, $t_2$, and $t_4$ is 0 V, corresponding to an imparted velocity nearly equal to the velocity of the center mass. To the contrary, in the waveform 600 the voltage at time to is the positive voltage amplitude $V_p$. The voltage at time $t_4$ is the negative voltage amplitude $V_n$. Accordingly, droplets 128 that leave the nozzle at time to have an imparted velocity that is significantly slower than the velocity of the center of mass. Droplets 128 that leave the nozzle at time $t_4$ have an imparted velocity that is significantly faster than the velocity of the center of mass. The result is much quicker coalescence of the entire group 126 of droplets 128.

Figure 6B:
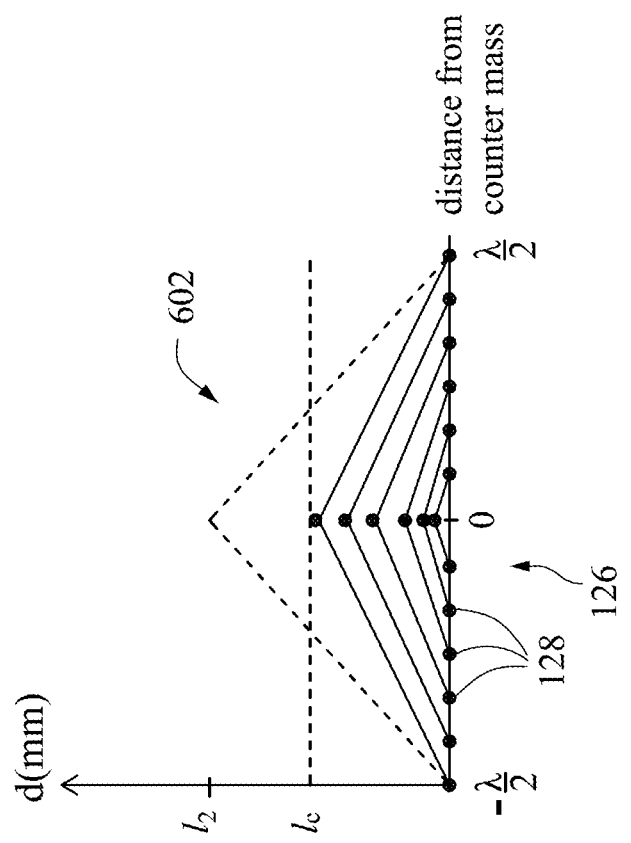
FIG. 6B is a graph illustrating droplet coalescence in connection with the voltage waveform of FIG. 6A, in accordance with some embodiments.

FIG. 6B is a graph illustrating coalescence of a group 126 of droplets, according to one embodiment. The group 126 of droplets 128 is output from the nozzle 118 while the waveform 600 (or 304) is applied to the piezoelectric structure surrounding the nozzle 118. The y-axis corresponds to distance from the nozzle 118 in millimeters. The x-axis corresponds to distance of the droplets 128 from center mass of the group 126. The first droplet 128 is initially $\lambda/2$ away from the center of mass of the group 126. The final droplet 128 is initially $-\lambda/2$ away from the center mass of the group 126. In one example, $\lambda$ is about 1.5 mm. In some embodiments, the result is a coalescence length $l_c$ less than 200 mm. In some embodiments, about 150 mm. The graph 602 also illustrates a length $l_2$ corresponding to the coalescence length for the waveform 500, although in the waveform 500 some of the droplets may not coalesce at all.

Figure 7A:
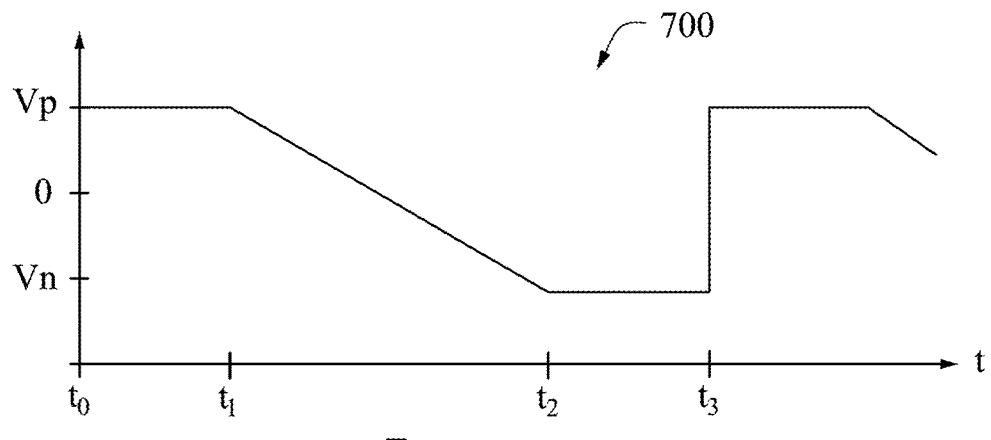
FIGS. 7A-7C are graphs of voltage waveforms, in accordance with some embodiments.
Figure 7B:
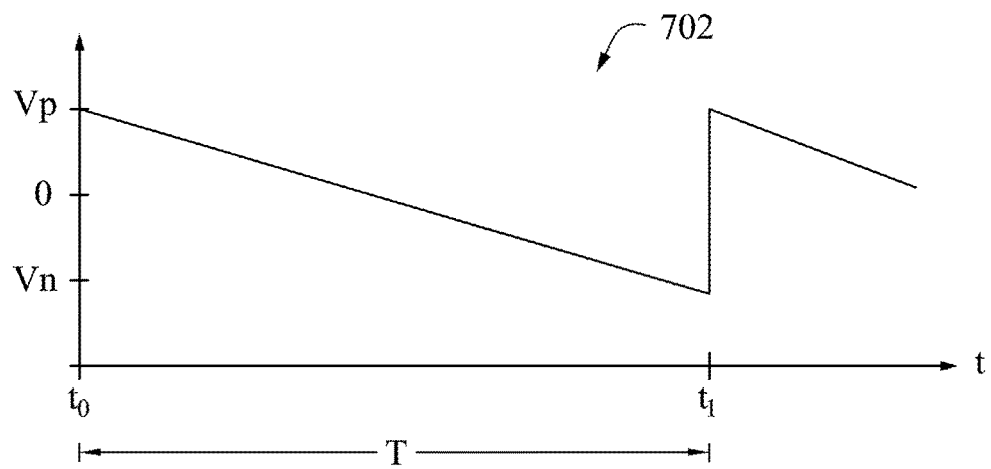
Figure 7C:
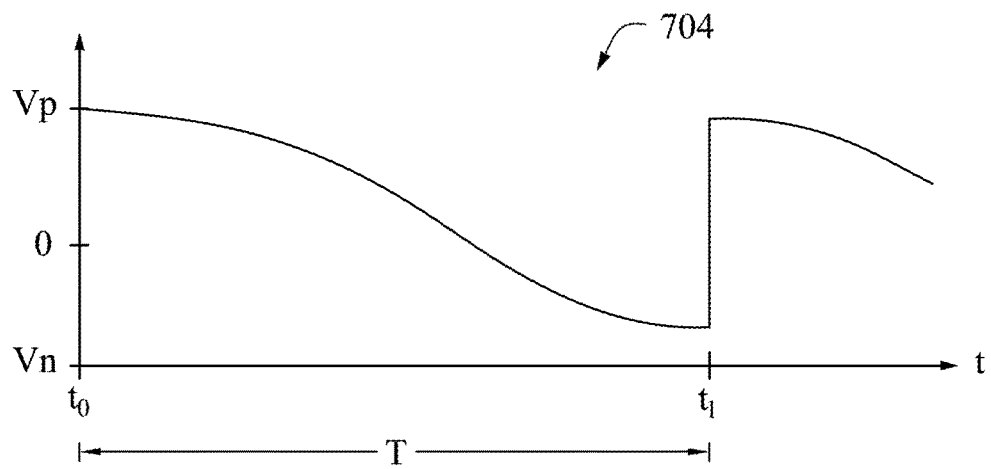

FIG. 7A-7C illustrate voltage waveforms that can be applied to the piezoelectric structure 120 of an EUV photolithography system such as the EUV photolithography systems 100 and 200 of FIGS. 1 and 2A-2B, according to some embodiments. FIG. 7A illustrates a waveform 700. Between times $t_0$ and $t_1$, the waveform 700 has a constant value equal to the positive voltage amplitude. Between times $t_1$ and $t_2$, the waveform 700 decreases at a linear rate from $V_p$ to the negative voltage amplitude $V_n$. Between times $t_2$ and $t_3$ the waveform 700 has a constant value of $V_n$. The period of the waveform 700 corresponds to the time between $t_0$-$t_3$. At time $t_3$, the waveform 700 jumps from $V_n$ to $V_p$ in the manner of a step function. The waveform 700 can correspond to the combination of a step function and a linearly decreasing function. The waveform 700 may result in coalescence of a group 128 of droplets prior to reaching the laser irradiation point.

FIG. 7B illustrates a waveform 702. Between times $t_0$ and $t_1$, the waveform 702 decreases at a linear rate from $V_p$ to $V_n$. The period of the waveform 700 corresponds to the time between $t_0$-$t_1$. At time $t_1$, the waveform 702 jumps from $V_n$ to $V_p$ in the manner of a step function. The waveform 702 may result in coalescence of a group 128 of droplets prior to reaching the laser irradiation point.

FIG. 7C illustrates a waveform 704. Between times $t_0$ and $t_1$, the waveform 704 decreases from $V_p$ to $V_n$ in the form of a half sinewave. The period of the waveform 704 corresponds to the time between $t_0$-$t_1$. At time $t_1$, the waveform 704 jumps from $V_n$ to $V_p$ in the manner of a step function. The waveform 704 may result in coalescence of a group 128 of droplets prior to reaching the laser irradiation point.

Figure 8:
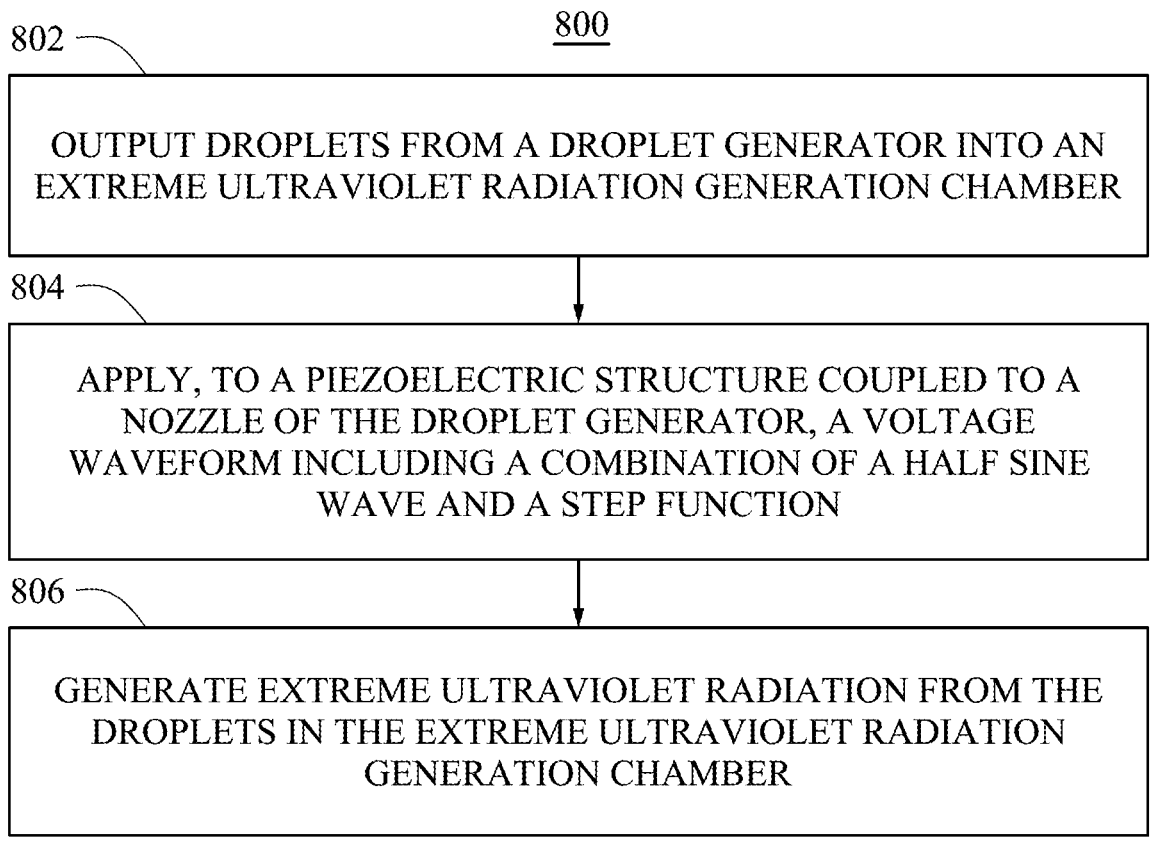
FIG. 8 is a flow diagram of a method for operating an EUV photolithography system, in accordance with some embodiments.

FIG. 8 is a flow diagram of a method 800 for operating an extreme ultraviolet photolithography system, according to some embodiments. At 802, the method 800 includes outputting droplets from a droplet generator into an extreme ultraviolet radiation generation chamber. One example of droplets is the droplets 128 of FIG. 2A. One example of a droplet generator is the droplet generator 102 of FIG. 2A. One example of an extreme ultraviolet generation chamber is the extreme ultraviolet radiation generation chamber 104 of FIG. 2A. At 804, the method 800 includes applying, to a piezoelectric structure coupled to a nozzle of the droplet generator, a voltage waveform including a combination of a half sine wave and a step function. One example of a voltage waveform is the voltage waveform 304 of FIG. 3C. One example of a piezoelectric structure is the piezoelectric structure 120 of FIG. 2A. One example of nozzle is the nozzle 118 of FIG. 2A. At 806, the method 800 includes generating extreme ultraviolet radiation from the droplets in the extreme ultraviolet radiation generation chamber.

Figure 9:
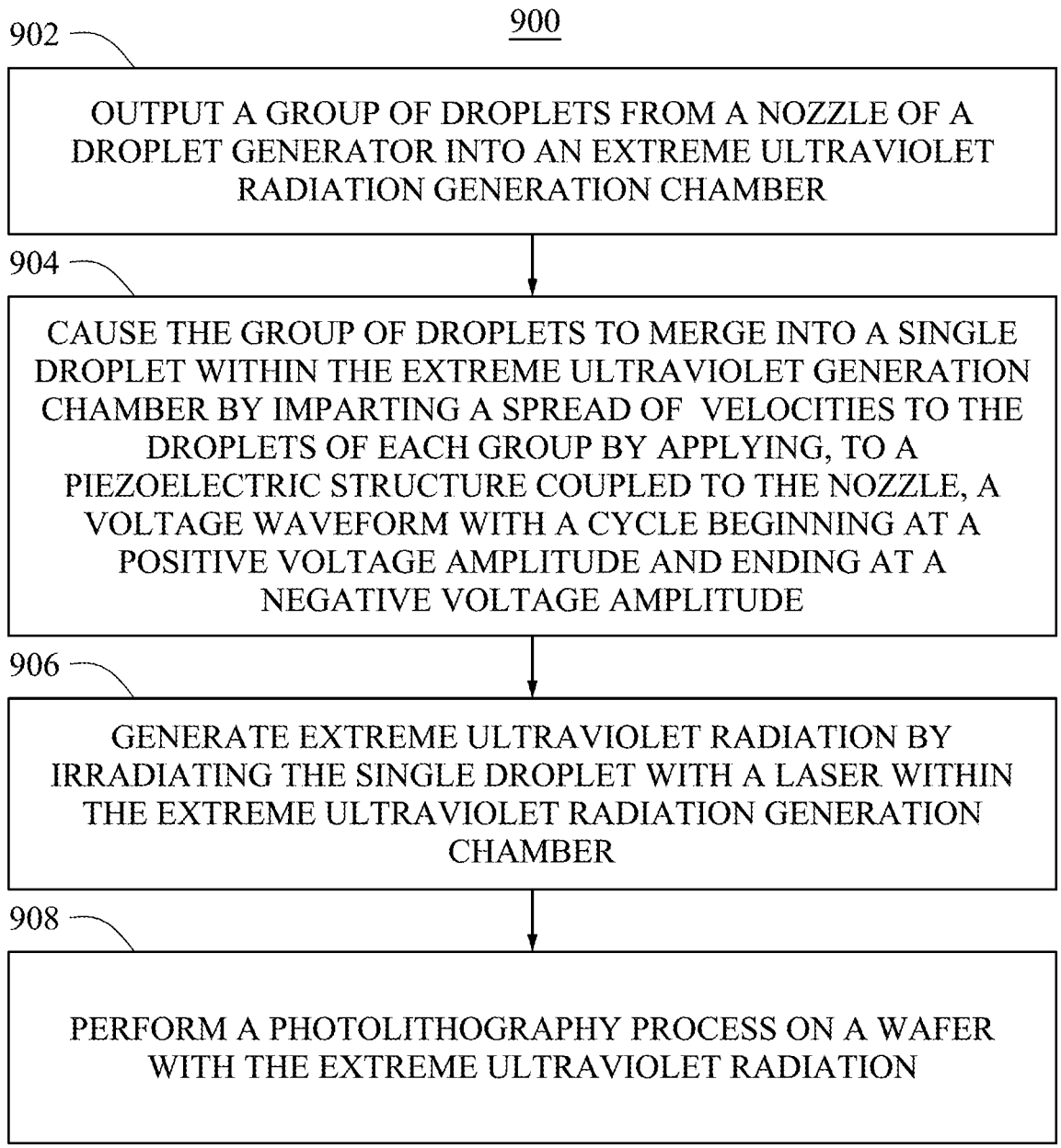
FIG. 9 is a flow diagram of a method for operating an EUV photolithography system, in accordance with some embodiments.

FIG. 9 is a flow diagram of a method 900 for operating an extreme ultraviolet photolithography system, according to some embodiments. At 902, the method 900 includes outputting a group of droplets from a nozzle of a droplet generator into an extreme ultraviolet radiation generation chamber. One example of a group of droplets is the group 126 of droplets 128 of FIG. 2A. One example of nozzle is the nozzle 118 of FIG. 2A. One example of an extreme ultraviolet generation chamber is the extreme ultraviolet radiation generation chamber 104 of FIG. 2A. At 904, the method 900 includes causing the group of droplets to merge into a single droplet within the extreme ultraviolet generation chamber by imparting a spread of velocities to the droplets of each group by applying, to a piezoelectric structure coupled to the nozzle, a voltage waveform with a cycle beginning at a positive voltage amplitude and ending at a negative voltage amplitude. One example of a voltage waveform is the voltage waveform 304 of FIG. 3C. One example of a piezoelectric structure is the piezoelectric structure 120 of FIG. 2A. At 906, the method 900 includes generating extreme ultraviolet radiation by irradiating the single droplet with a laser within the extreme ultraviolet radiation generation chamber. One example of a laser is the laser 112 of FIG. 2A. At 908, the method 900 includes performing a photolithography process on a wafer with the extreme ultraviolet radiation.

In one embodiment, a method includes outputting droplets from a droplet generator into an extreme ultraviolet radiation generation chamber. The method includes applying, to a piezoelectric structure coupled to a nozzle of the droplet generator, a voltage waveform including a combination of a half sine wave and a step function. The method includes generating extreme ultraviolet radiation from the droplets in the extreme ultraviolet radiation generation chamber.

In one embodiment, a system includes an extreme ultraviolet generation chamber. The system includes a droplet generator configured to output droplets into the extreme ultraviolet generation chamber and including a nozzle and a piezoelectric structure coupled to the nozzle. The system includes a laser configured to irradiate the droplets in the extreme ultraviolet generation chamber. The system includes a control system configured to apply to the piezoelectric structure a voltage waveform including a combination of a step function and a half sine wave.

In one embodiment, a method includes outputting a group of droplets from a nozzle of a droplet generator into an extreme ultraviolet radiation generation chamber and causing the group of droplets to merge into a single droplet within the extreme ultraviolet radiation generation chamber by imparting a spread of velocities to the droplets of each group by applying, to a piezoelectric structure coupled to the nozzle, a voltage waveform with a cycle beginning at a positive voltage amplitude and ending at a negative voltage amplitude. The method includes generating extreme ultraviolet radiation by irradiating the single droplet with a laser within the extreme ultraviolet radiation generation chamber and performing a photolithography process on a wafer with the extreme ultraviolet radiation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   outputting droplets from a droplet generator into an extreme ultraviolet radiation generation chamber;
   applying, to a piezoelectric structure coupled to a nozzle of the droplet generator, a voltage waveform including a combination of a half sine wave and a step function; and
   generating extreme ultraviolet radiation from the droplets in the extreme ultraviolet radiation generation chamber.

2. The method of claim 1, wherein outputting the droplets includes outputting a group of droplets during each cycle of the waveform.

3. The method of claim 2, further comprising imparting a spread of velocities to the droplets of each group by applying the waveform to the piezoelectric structure.

4. The method of claim 3, wherein the spread of velocities causes the droplets of each group to coalesce into a single droplet.

5. The method of claim 4, wherein imparting the spread of velocities causes a first droplet in each group to have a lower velocity than a final droplet in each group.

6. The method of claim 4, further comprising generating the extreme ultraviolet radiation by irradiating the single droplet of each group with a laser.

7. A system, comprising:
an extreme ultraviolet radiation generation chamber;
a droplet generator configured to output droplets into the extreme ultraviolet radiation generation chamber and including:
a nozzle; and
a piezoelectric structure coupled to the nozzle;
a laser configured to irradiate the droplets in the extreme ultraviolet radiation generation chamber; and
a control system configured to apply to the piezoelectric structure a voltage waveform including a combination of a step function and a half sine wave.

8. The system of claim 7, wherein the droplets include liquid tin.

9. The system of claim 7, wherein the control system is configured to apply the voltage waveform while the droplet generator is generating droplets.

10. The system of claim 9, wherein the droplet generator is configured to output a group of droplets during each cycle of the voltage waveform.

11. The system of claim 10, wherein the voltage waveform causes the droplets of each group to coalesce into a single droplet prior to irradiation with the laser.

12. The system of claim 9, wherein the voltage waveform causes the droplets of each group to coalesce less than 200 mm from the nozzle.

13. The system of claim 7, wherein the piezoelectric structure surrounds the nozzle.

14. The system of claim 13, wherein the voltage waveform causes the piezoelectric structure to generate a sonic pulse within the nozzle.

15. A method, comprising:
outputting a group of droplets from a nozzle of a droplet generator into an extreme ultraviolet radiation generation chamber;
causing the group of droplets to merge into a single droplet within the extreme ultraviolet generation chamber by imparting a spread of velocities to the droplets of each group by applying, to a piezoelectric structure coupled to the nozzle, a voltage waveform with a cycle beginning at a positive voltage amplitude and ending at a negative voltage amplitude;
generating extreme ultraviolet radiation by irradiating the single droplet with a laser within the extreme ultraviolet radiation generation chamber; and
performing a photolithography process on a wafer with the extreme ultraviolet radiation.

16. The method of claim 15, wherein outputting the group of droplets includes outputting the droplets consecutively.

17. The method of claim 16, wherein the spread of velocities includes causing each droplet other than a first droplet to have a higher velocity than an immediately preceding droplet.

18. The method of claim 17, wherein the waveform includes decreasing the voltage from a positive amplitude with the half sine wave to a low amplitude and then increasing from the low amplitude to the high amplitude with the step function.

19. The method of claim 18, further comprising generating a sonic pulse within the nozzle by applying the voltage waveform.

20. The method of claim 15, wherein the group of droplets includes more than 50 droplets.

* * * * *